United States Patent
Yamamoto

(10) Patent No.: US 11,664,765 B2
(45) Date of Patent: May 30, 2023

(54) CIRCUIT DEVICE AND OSCILLATOR

(71) Applicant: Seiko Epson Corporation, Tokyo (JP)

(72) Inventor: Takehiro Yamamoto, Matsumoto (JP)

(73) Assignee: SEIKO EPSON CORPORATION

(*) Notice: Subject to any disclaimer, the term of this patent is extended or adjusted under 35 U.S.C. 154(b) by 0 days.

(21) Appl. No.: 17/732,832

(22) Filed: Apr. 29, 2022

(65) Prior Publication Data
US 2022/0352852 A1    Nov. 3, 2022

(30) Foreign Application Priority Data
Apr. 30, 2021 (JP) .............................. JP2021-077280

(51) Int. Cl.
| | | |
|---|---|---|
| *H03B 5/04* | (2006.01) | |
| *H03B 5/32* | (2006.01) | |
| *H03L 1/00* | (2006.01) | |
| *H03B 5/36* | (2006.01) | |

(52) U.S. Cl.
CPC .............. *H03B 5/366* (2013.01); *H03B 5/04* (2013.01); *H03B 5/32* (2013.01); *H03B 5/362* (2013.01); *H03L 1/00* (2013.01); *H03B 2200/009* (2013.01); *H03B 2200/0034* (2013.01)

(58) Field of Classification Search
CPC ... H03B 5/04; H03B 5/06; H03B 5/30; H03B 5/32; H03B 5/326; H03B 5/36; H03B 5/362; H03B 5/364; H03B 5/366; H03B 5/368; H03B 2200/0034; H03B 2200/0088; H03B 2200/009; H03B 2200/0094; H03L 1/00; H03L 3/00
See application file for complete search history.

(56) References Cited

U.S. PATENT DOCUMENTS

| | | | | |
|---|---|---|---|---|
| 3,523,258 | A  * | 8/1970 | Niemoeller | H03L 1/023 331/109 |
| 2012/0176763 | A1* | 7/2012 | Asamura | H03B 7/06 361/820 |
| 2016/0218719 | A1* | 7/2016 | Yamamoto | H03L 1/02 |
| 2018/0254742 | A1* | 9/2018 | Akhavan | H03B 5/362 |
| 2019/0006992 | A1* | 1/2019 | Marques | H03B 5/366 |
| 2020/0313614 | A1 | 10/2020 | Sawada | |

FOREIGN PATENT DOCUMENTS

JP    2020-170884 A    10/2020

* cited by examiner

*Primary Examiner* — Levi Gannon
(74) *Attorney, Agent, or Firm* — Harness, Dickey & Pierce, P.L.C.

(57) ABSTRACT

A circuit device includes an oscillation circuit configured to generate an oscillation signal, a first pre-driver disposed in a posterior stage of the oscillation circuit, a first output driver disposed in a posterior stage of the first pre-driver, a first regulator configured to supply a first regulated voltage to the first pre-driver, and a second regulator configured to supply a second regulated voltage to the first output driver, wherein the second regulator is shorter in transient response time than the first regulator.

8 Claims, 13 Drawing Sheets

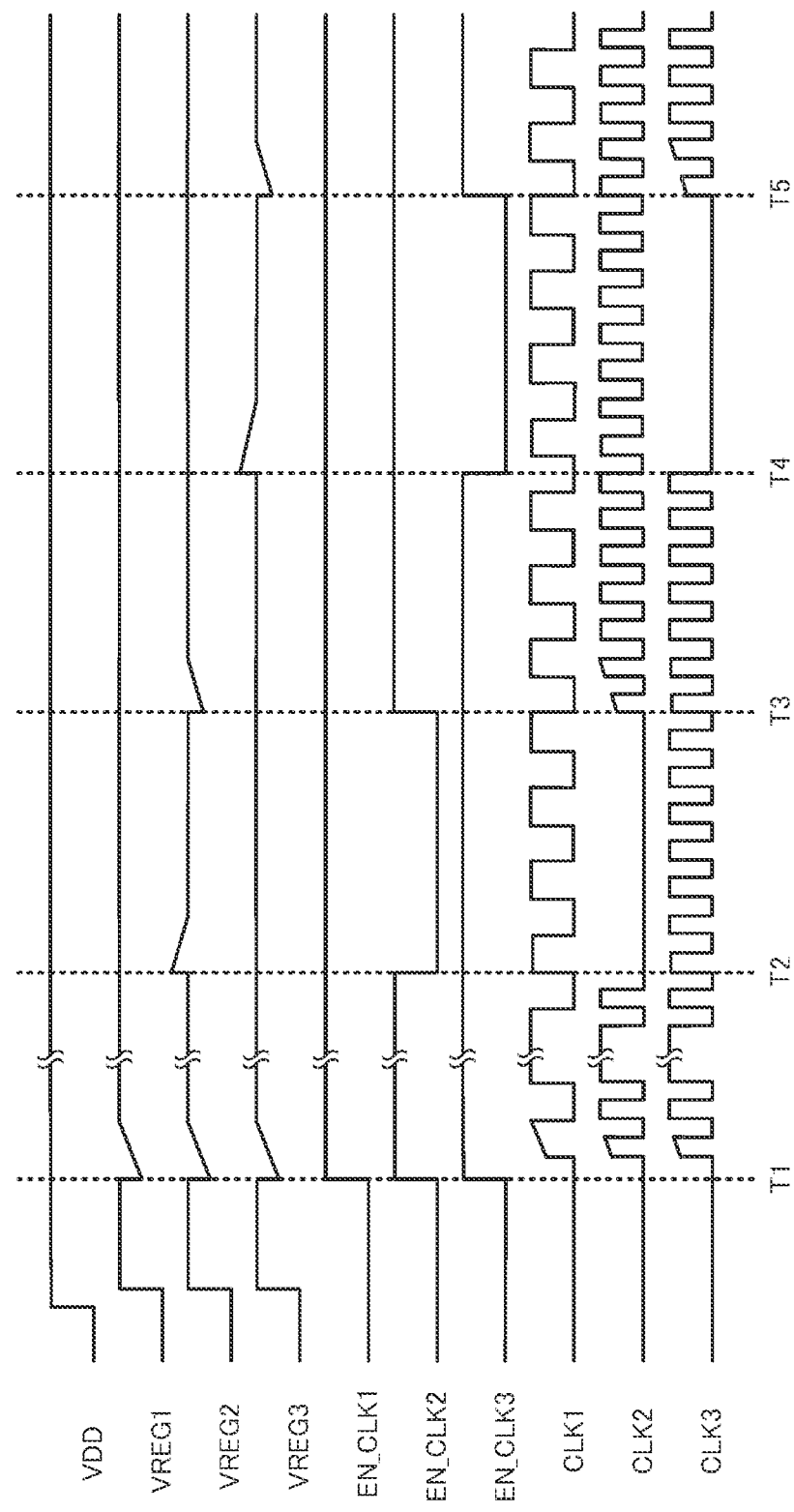

CIRCUIT DEVICE AND OSCILLATOR

The present application is based on, and claims priority from JP Application Serial Number 2021-077280, filed Apr. 30, 2021, the disclosure of which is hereby incorporated by reference herein in its entirety.

BACKGROUND

1. Technical Field

The present disclosure relates to a circuit device and an oscillator.

2. Related Art

In JP-A-2020-170884 (Document 1), there is disclosed an oscillator in which a temperature compensation circuit and an output circuit are supplied with respective regulated voltages from regulators different from each other to thereby prevent a phase noise and so on caused by a deterioration of the accuracy of the temperature compensation from occurring, and thus make it possible to increase the accuracy of a clock signal.

The regulator disclosed in Document 1 is provided with a band-limiting filter constituted by a resistor element and a capacitance element to thereby realize reduction of the noise.

However, since the regulator described in Document 1 is difficult to follow an instantaneous current variation, and is slow in response, the time required for the regulated voltage to be restored to the original voltage after the regulated voltage fluctuates when the output signal starts to be output becomes long. Therefore, it takes time until the waveform of the output signal stabilizes, and there is a possibility that the waveform quality immediately after the start of the output deteriorates.

SUMMARY

A circuit device according to an aspect of the present disclosure includes an oscillation circuit configured to generate an oscillation signal, a first pre-driver disposed in a posterior stage of the oscillation circuit, a first output driver disposed in a posterior stage of the first pre-driver, a first regulator configured to supply a first regulated voltage to the first pre-driver, and a second regulator configured to supply a second regulated voltage to the first output driver, wherein the second regulator is shorter in transient response time than the first regulator.

An oscillator according to another aspect of the present disclosure includes the circuit device according to the aspect, and a resonator.

BRIEF DESCRIPTION OF THE DRAWINGS

FIG. 14 is a diagram showing an example of a timing chart in Comparative Example 2.

DESCRIPTION OF EXEMPLARY EMBODIMENTS

Some preferred embodiments of the present disclosure will hereinafter be described using the drawings. The drawings used herein are for the sake of convenience of explanation. It should be noted that the embodiments described hereinafter do not unreasonably limit the contents of the present disclosure as set forth in the appended claims. Further, all of the constituents described below are not necessarily essential elements of the present disclosure.

1. First Embodiment 1-1. Configuration of Oscillator

Figure 1:
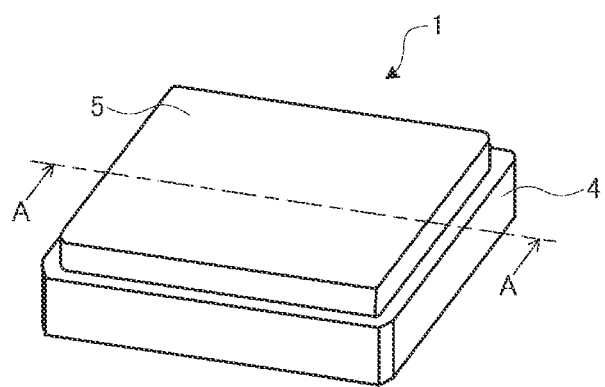
FIG. 1 is a perspective view of an oscillator.
Figure 2:
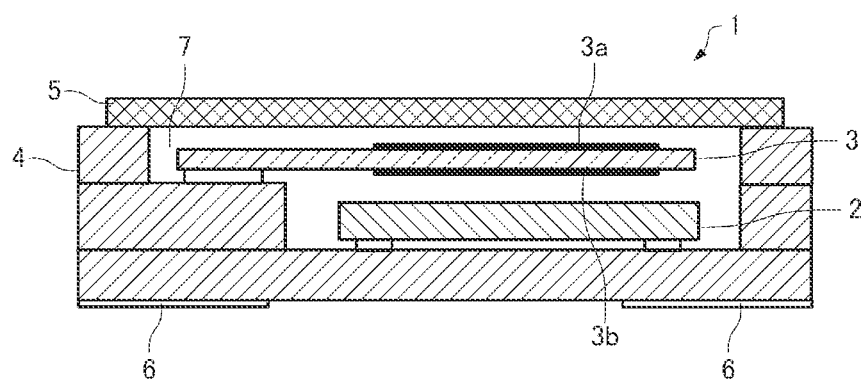
FIG. 2 is a cross-sectional view along the line A-A of the oscillator shown in FIG. 1.

FIG. 1 and FIG. 2 are diagrams showing an example of a structure of an oscillator 1 according to the present embodiment. FIG. 1 is a perspective view of the oscillator 1, and FIG. 2 is a cross-sectional view along the line A-A shown in FIG. 1.

As shown in FIG. 1 and FIG. 2, the oscillator 1 includes a circuit device 2, a resonator 3, a package 4, a lid 5, and a plurality of external terminals 6. In the present embodiment, the resonator 3 is a quartz crystal resonator using quartz crystal as a substrate material, and is, for example, an AT-cut crystal resonator or a tuning-fork crystal resonator. The resonator 3 can be an SAW (Surface Acoustic Wave) resonator or an MEMS (Micro Electro Mechanical Systems) resonator. Further, as the substrate material of the resonator 3, there can be used a piezoelectric single crystal of lithium tantalate, lithium niobate, or the like, a piezoelectric material such as piezoelectric ceramics including lead zirconate titanate, or a silicon semiconductor material besides the quartz crystal. As an excitation device of the resonator 3, there can be used a device using a piezoelectric effect, or electrostatic drive using a coulomb force. Further, in the present embodiment, the circuit device 2 is realized by a single-chip integrated circuit (IC). It should be noted that the circuit device 2 can at least partially be constituted by discrete components.

The package 4 houses the circuit device 2 and the resonator 3 in the same space. Specifically, the package 4 is provided with a recessed part, and the recessed part is covered with the lid 5 to thereby form a housing chamber 7. On surfaces of an inside or a recessed part of the package 4, there are disposed interconnections not shown for electrically coupling two terminals of the circuit device 2, specifically, an XO terminal and an XI terminal shown in FIG. 3 described later, and two excitation electrodes 3a, 3b of the resonator 3 respectively to each other. Further, on the surfaces of the inside or the recessed part of the package 4, there are disposed interconnections not shown for electrically coupling the terminals of the circuit device 2 and the external terminals 6 disposed on a bottom surface of the package 4 respectively to each other. It should be noted that the package 4 is not limited to a configuration of housing the circuit device 2 and the resonator 3 in the same space. For example, it is possible to adopt a so-called H-type package in which the circuit device 2 is mounted on one surface of a substrate of the package, and the resonator 3 is mounted on the other surface thereof.

The resonator 3 has the excitation electrodes 3a, 3b each made of metal and respectively disposed on an obverse side and a reverse side of the resonator 3, and oscillates with a desired frequency corresponding to the shape and the mass of the resonator 3 including the excitation electrodes 3a, 3b.

Figure 3:
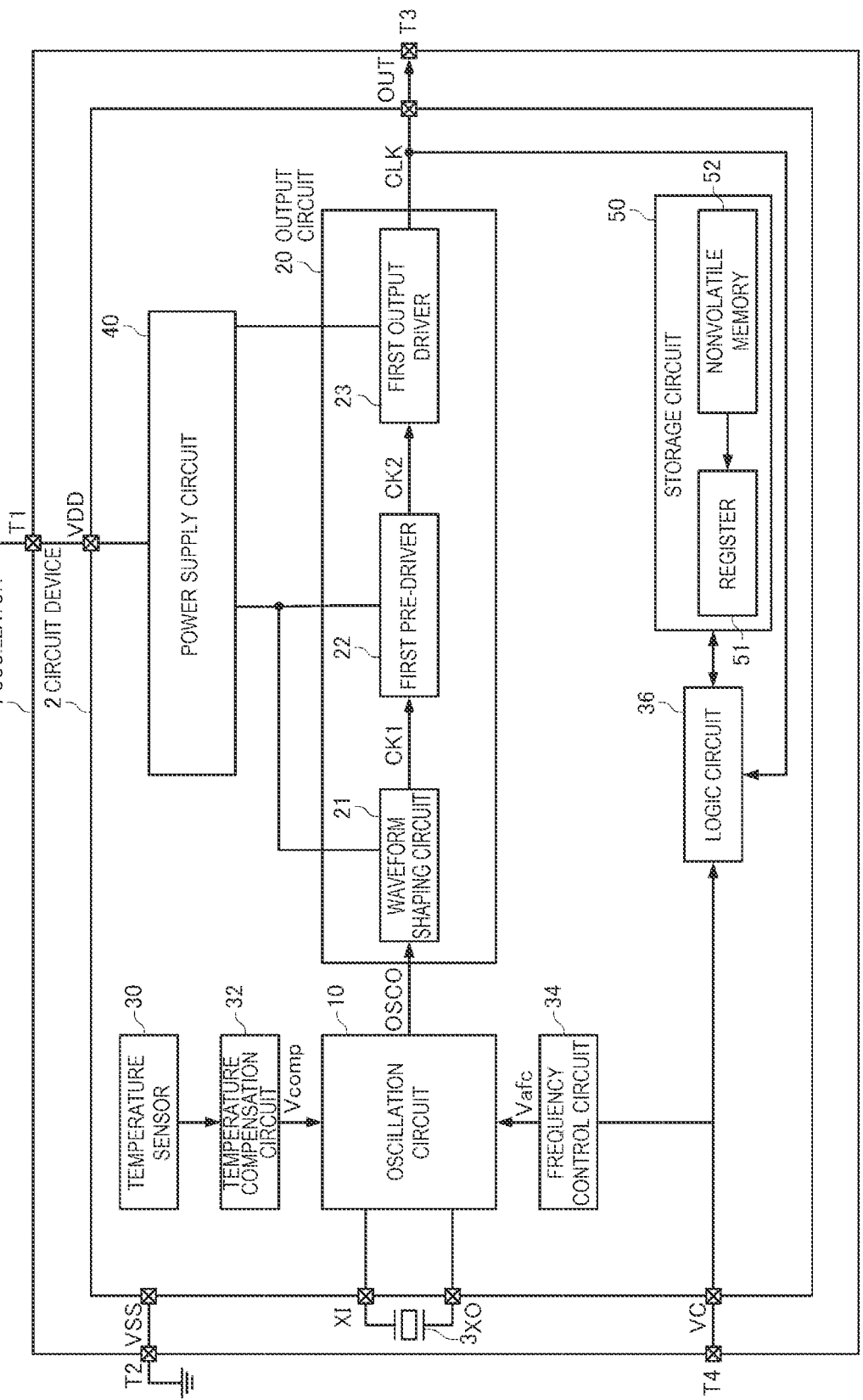
FIG. 3 is a diagram showing a schematic configuration of the oscillator.

FIG. 3 is a functional block diagram of the oscillator 1 according to the first embodiment. As shown in FIG. 3, the oscillator 1 according to the present embodiment includes the circuit device 2 and the resonator 3. The circuit device 2 has a VDD terminal, a VSS terminal, an OUT terminal, a VC terminal, the XI terminal, and the XO terminal as external coupling terminals. The VDD terminal, the VSS terminal, the OUT terminal, and the VC terminal are electrically coupled respectively to a T1 terminal, a T2 terminal, a T3 terminal, and a T4 terminal as the plurality of external terminals 6 of the oscillator 1 shown in FIG. 2.

In the present embodiment, the circuit device 2 includes an oscillation circuit 10, an output circuit 20, a temperature sensor 30, a temperature compensation circuit 32, a frequency control circuit 34, the logic circuit 36, a power supply circuit 40, and a storage circuit 50. It should be noted that the circuit device 2 can be provided with a configuration obtained by omitting or modifying some of these constituents, or adding other constituents.

The oscillation circuit 10 generates an oscillation signal OSCO. The oscillation circuit 10 is a circuit which is electrically coupled to the XI terminal and the XO terminal to oscillate the resonator 3. Specifically, a signal output from the resonator 3 is input to the oscillation circuit 10 via the XI terminal, and the oscillation circuit 10 amplifies that signal and then supplies the result to the resonator 3 via the XO terminal.

The temperature sensor 30 is a device for detecting the temperature of the circuit device 2 to output a temperature signal having a voltage corresponding to the temperature, and is realized by, for example, a circuit using a temperature characteristic of a bandgap reference circuit.

The temperature compensation circuit 32 generates a temperature compensation voltage Vcomp for correcting a frequency-temperature characteristic of the oscillation signal OSCO output from the oscillation circuit 10 based on the temperature signal output from the temperature sensor 30 and the temperature compensation data corresponding to a frequency-temperature characteristic of the resonator 3, and then supplies the result to the oscillation circuit 10. The temperature compensation data is supplied to the temperature compensation circuit 32 from the logic circuit 36.

To the frequency control circuit 34, there is supplied the frequency control signal input from the T4 terminal via the VC terminal. Then, the frequency control circuit 34 generates a frequency control voltage Vafc for controlling the oscillation frequency of the oscillation circuit 10 in accordance with a voltage level of the frequency control signal, and then supplies the result to the oscillation circuit 10.

Due to the temperature compensation voltage Vcomp, the oscillation signal OSCO output by the oscillation circuit becomes to have a substantially constant frequency corresponding to the frequency control voltage Vafc at an arbitrary temperature included in a predetermined temperature range. The oscillation signal OSCO is input to the output circuit 20.

The logic circuit 36 controls an operation of each of the circuits. Specifically, the logic circuit 36 sets an operation mode of the oscillator 1 or the circuit device 2 to one of modes including an external communication mode, a normal operation mode, and a variety of examination modes based on a control signal input to a terminal of the circuit device 2, and then performs control corresponding to the operation mode thus set. In the present embodiment, when the control signal having a predetermined pattern is input from the VC terminal within a predetermined period from when the supply of the power supply voltage VDD to the VDD terminal starts, the logic circuit 36 sets the operation mode to the external communication mode after the predetermined period elapses. For example, it is possible for the logic circuit 36 to assume a period until it is detected that the resonator 3 starts the oscillation due to the supply of the power supply voltage VDD and then the oscillation stabilizes as the predetermined period, or it is possible for the logic circuit 36 to count the number of pulses of the oscillation signal, and then determine that the predetermined period has elapsed when the count value has reached a predetermined value. Further, for example, it is possible for the logic circuit 36 to measure the predetermined period based on an output signal of an RC time-constant circuit which starts to operate due to the supply of the power supply voltage VDD.

In the external communication mode, a serial clock signal and a serial data signal are input to the logic circuit 36 in sync with each other from the VC terminal and the OUT terminal. In the external communication mode, the logic circuit 36 samples the serial data signal at every edge of the serial clock signal according to the standard of, for example, the I$^2$C (Inter-Integrated Circuit) bus. Then, based on commands and data thus sampled, the logic circuit 36 performs processing such as setting of the operation mode, setting of the clock selection data and the switch control data in each of the operation modes, reading and writing of data from and to a register 51 or a nonvolatile memory 52. It should be noted that the logic circuit 36 functions as an interface circuit of a two-wire bus such as the I$^2$C (Inter-Integrated Circuit) bus in the present embodiment, but can function as an interface circuit of a three-wire bus or a four-wire bus such as the SPI (Serial Peripheral Interface) bus.

For example, when the logic circuit 36 has sampled a normal operation mode setting command in the external communication mode, the logic circuit 36 makes the transition of the operation mode from the external communication mode to the normal operation mode. As a result, a clock signal CLK with a frequency corresponding to the voltage at the VC terminal is output to the outside from the OUT terminal via the T3 terminal.

It should be noted that when the control signal having the predetermined pattern is not input from the VC terminal within the predetermined period from when the supply of the power supply voltage VDD starts, the logic circuit 36 sets the operation mode directly to the normal operation mode after the predetermined period elapses without setting the operation mode to the external communication mode.

The power supply circuit 40 generates a variety of constant voltages based on the power supply voltage VDD supplied from the outside via the T1 terminal and the VDD terminal, and supplies the constant voltages to the individual circuits. For example, it is possible for the power supply circuit 40 to include a plurality of regulators which generates the constant voltages based on an output voltage of the bandgap reference circuit.

The storage circuit 50 is a circuit for storing a variety of types of information, and has the register 51 and the nonvolatile memory 52. The nonvolatile memory 52 is, for example, an MONOS (metal oxide nitride oxide silicon) memory or an EEPROM (Electrically Erasable Programmable Read-Only Memory). In a manufacturing process of the oscillator 1, a variety of types of information such as the temperature compensation data, the frequency division ratio data, and the clock selection data are stored in the nonvolatile memory 52. Then, when the power is applied to the oscillator 1, the variety of types of information stored in the nonvolatile memory 52 are transferred to the register 51, and the variety of types of information stored in the register 51 are arbitrarily supplied to the respective circuits via the logic circuit 36.

1-2. Configuration of Output Circuit

Figure 4:
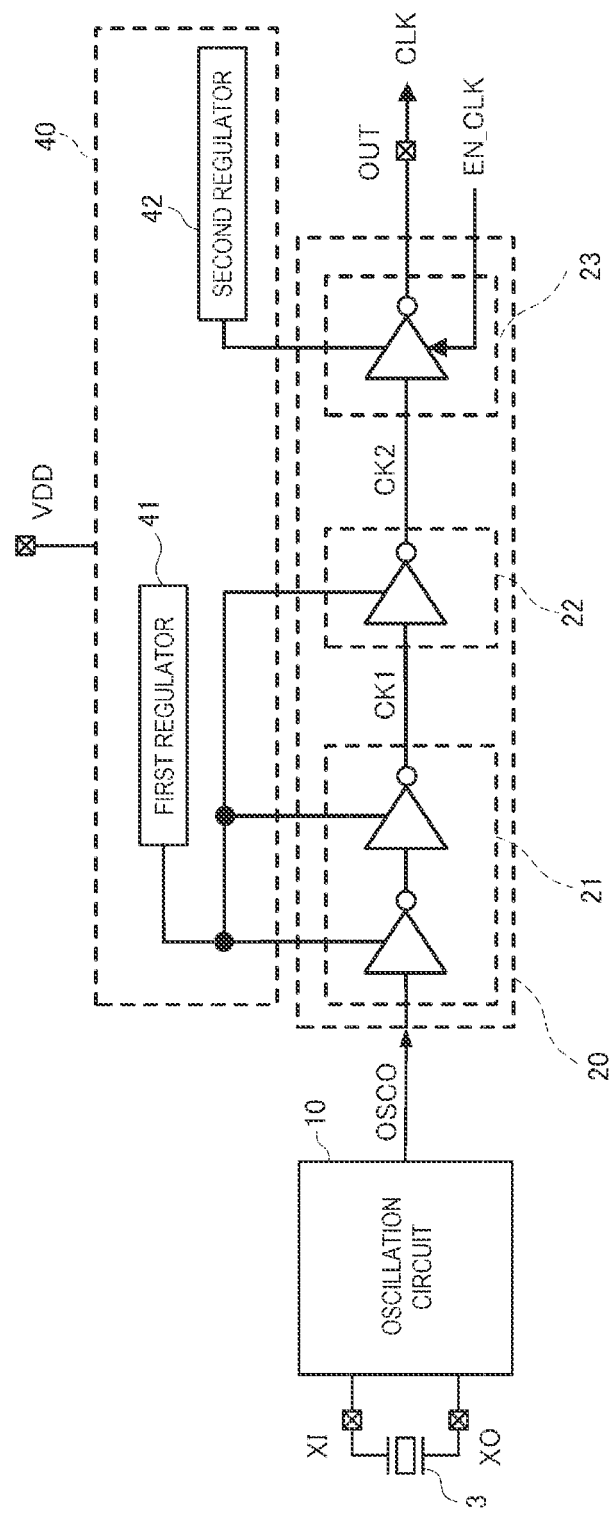
FIG. 4 is a diagram showing a schematic configuration of an output circuit.

FIG. 4 is a diagram showing a schematic configuration of the output circuit 20. The output circuit 20 includes a waveform shaping circuit 21, a first pre-driver 22, and a first output driver 23.

The waveform shaping circuit 21 performs waveform shaping on the oscillation signal OSCO to generate a clock signal CK1, and then outputs the clock signal CK1 to the first pre-driver 22. Specifically, the waveform shaping circuit 21 shapes the oscillation signal OSCO into a rectangular wave, and then outputs the clock signal CK1 thus shaped to the first pre-driver 22. In other words, the waveform shaping circuit 21 generates the clock signal CK1 as a first signal based on the oscillation signal OSCO, and then outputs the clock signal CK1 to the first pre-driver 22. The waveform shaping circuit 21 is disposed on a signal path between the oscillation circuit 10 and the first pre-driver 22.

The first pre-driver 22 outputs a clock signal CK2 obtained by buffering the clock signal CK1 output from the waveform shaping circuit 21 to the first output driver 23. Specifically, the first pre-driver 22 generates the clock signal CK2 as a second signal based on the clock signal CK1 as the first signal, and then outputs the clock signal CK2 to the first output driver 23. The first pre-driver 22 also functions as a level shifter for outputting the clock signal CK2 at a voltage level matched to an input voltage level of the first output driver 23. The first pre-driver 22 is disposed in a posterior stage of the oscillation circuit 10.

The first output driver 23 buffers the clock signal CK2 output from the first pre-driver 22 to generate the clock signal CLK. The clock signal CLK thus generated is output from the oscillator 1 via the OUT terminal and the T3 terminal. In other words, the first output driver 23 outputs the clock signal CLK as an output signal to the OUT terminal based on the clock signal CK2 as the second signal. For example, the clock signal CLK can be a CMOS output waveform, or can also be a clipped sine wave. The first output driver 23 is disposed in a posterior stage of the first pre-driver 22.

The first output driver 23 is electrically coupled to the OUT terminal. Further, the clock signal CLK is output to the outside of the circuit device 2 in accordance with an enable signal EN_CLK supplied from the logic circuit 36. In other words, the first output driver 23 is controlled by the enable signal EN_CLK. Since it is possible to control the clock signal CLK not to be output to the outside of the circuit device 2 when the clock signal CLK is unnecessary, it is possible to suppress the power consumption of the circuit device 2.

1-3. Configuration of Regulator

Figure 5:
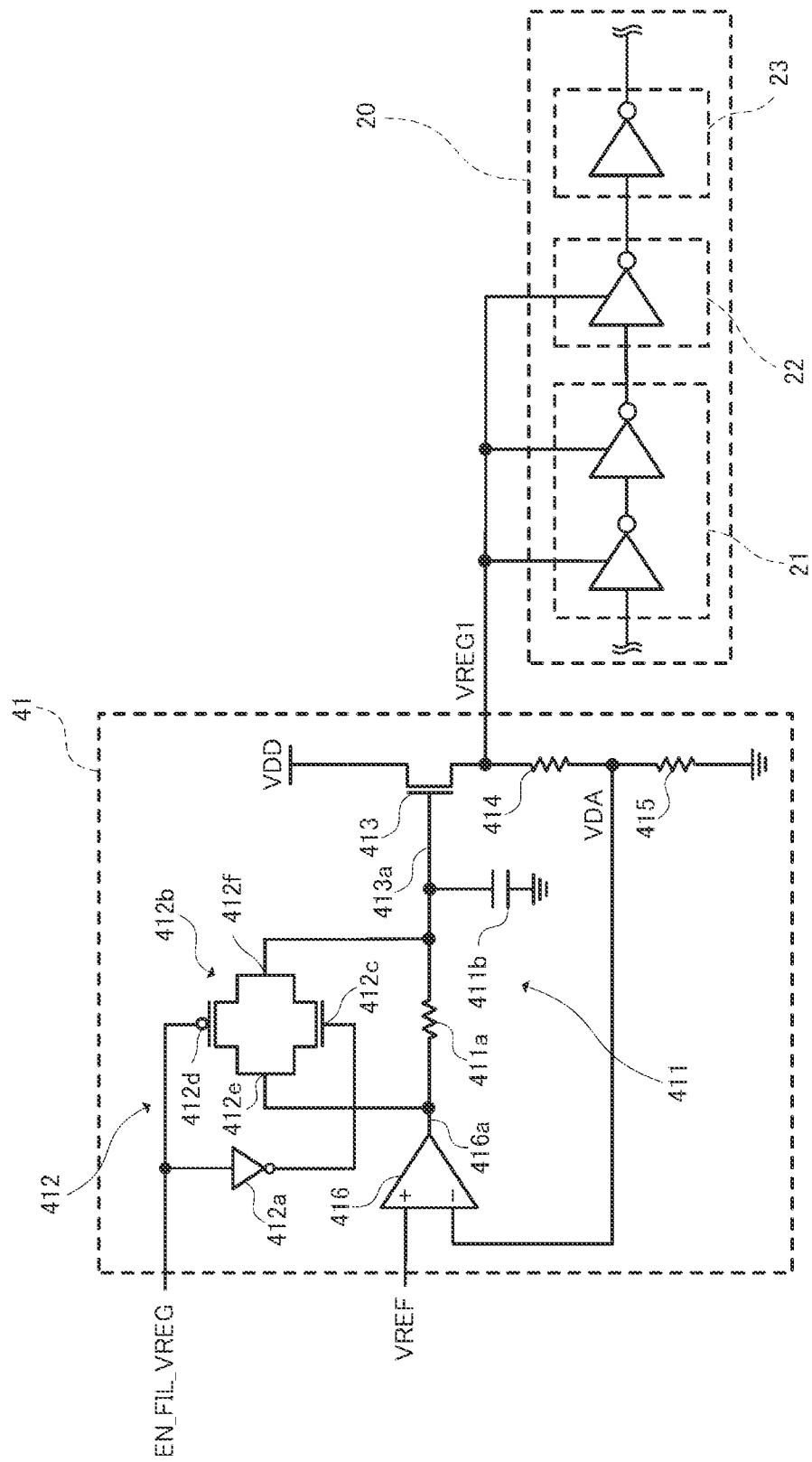
FIG. 5 is a diagram showing a schematic configuration of a first regulator.

FIG. 5 is a diagram showing a schematic configuration of a first regulator 41. The first regulator is provided with a band-limiting filter 411. The first regulator 41 is provided with a switch circuit 412, a transistor 413, resistors 414, 415, and an operational amplifier 416. Further, a reference signal EN_FIL_VREG and a reference voltage VREF are input to the first regulator 41, and the first regulator 41 outputs a first regulated voltage VREG1. It should be noted that the first regulator 41 can be provided with a configuration obtained by omitting or modifying some of these constituents, or adding other constituents.

The band-limiting filter 411 is provided with a resistor 411a and a capacitor 411b. One end of the resistor 411a is electrically coupled to an output node 416a of the operational amplifier 416, and an input end 412e of a transfer gate 412b. Meanwhile, the other end of the resistor 411a is electrically coupled to one end of the capacitor 411b, a gate node 413a of the transistor 413, and an output end 412f of the transfer gate 412b. Further, the other end of the capacitor 411b is electrically coupled to the ground. For example, the band-limiting filter 411 provided with the resistor 411a and the capacitor 411b can be provided with a function of an RC low-pass filter. In general, the RC low-pass filter transmits a low-frequency component of an input signal, and blocks a high-frequency component thereof.

Further, the first regulator 41 is provided with the switch circuit 412 for enabling or disabling the band-limiting filter 411. The switch circuit 412 has an inverter 412a as a NOT circuit, and the transfer gate 412b.

The reference signal EN_FIL_VREG output by the logic circuit 36 is input to a positive control end 412c of the transfer gate 412b, then logically inverted by the inverter 412a, and is also input to a negative control end 412d of the transfer gate 412b. Further, the input end 412e of the transfer gate 412b is coupled to the output node 416a of the operational amplifier 416. The output end 412f of the transfer gate 412b is electrically coupled to the gate node 413a of the transistor 413.

When the reference signal EN_FIL_VREG is in the L level, the input end 412e and the output end 412f of the transfer gate 412b are set to a nonconducting state, and the switch circuit 412 is set to an OFF state. In contrast, when the reference signal EN_FIL_VREG is in the H level, the input end 412e and the output end 412f of the transfer gate 412b are set to a conducting state, and the switch circuit 412 is set to an ON state.

When the reference signal EN_FIL_VREG is in the L level, an output signal of the operational amplifier 416 is transmitted to the gate of the transistor 413 via the transfer gate 412b. In contrast, when the reference signal EN_FIL_VREG is in the H level, the output signal of the operational amplifier 416 is transmitted to the gate of the transistor 413 via the resistor 411a and the capacitor 411b.

Specifically, when the reference signal EN_FIL_VREG is in the L level, the band-limiting filter 411 is disabled, and when the reference signal EN_FIL_VREG is in the H level, the band-limiting filter 411 is enabled.

The transistor 413 and the resistors 414, 415 are disposed in series between the power supply voltage VDD and the ground. For example, the transistor 413 is an N-type transistor, and the drain thereof is supplied with the power supply voltage VDD, and the first regulated voltage VREG1 is output from the source thereof electrically coupled to the resistors 414, 415. Further, by adjusting resistance values of the resistors 414, 415, it is possible to adjust the first regulated voltage VREG1.

The reference voltage VREF is input to a non-inverting input terminal of the operational amplifier 416, and to an inverting input terminal thereof, there is input a divisional voltage VDA obtained by dividing the first regulated voltage VREG1 with the resistors 414, 415. The output signal of the operational amplifier 416 is input to the gate of the transistor 413, and the first regulated voltage VREG1 is output from the drain of the transistor 413.

The first regulator 41 supplies the first regulated voltage VREG1 to the first pre-driver 22. Further, the waveform shaping circuit 21 can be supplied with the first regulated voltage VREG1, or can also be supplied with a different regulated voltage. It should be noted that by supplying the first regulated voltage VREG1 to the waveform shaping circuit 21, it is possible to reduce the number of the regulators required since the first pre-driver 22 is also supplied with the same first regulated voltage VREG1. It is possible to simplify the configuration of the circuit device 2.

Figure 6:
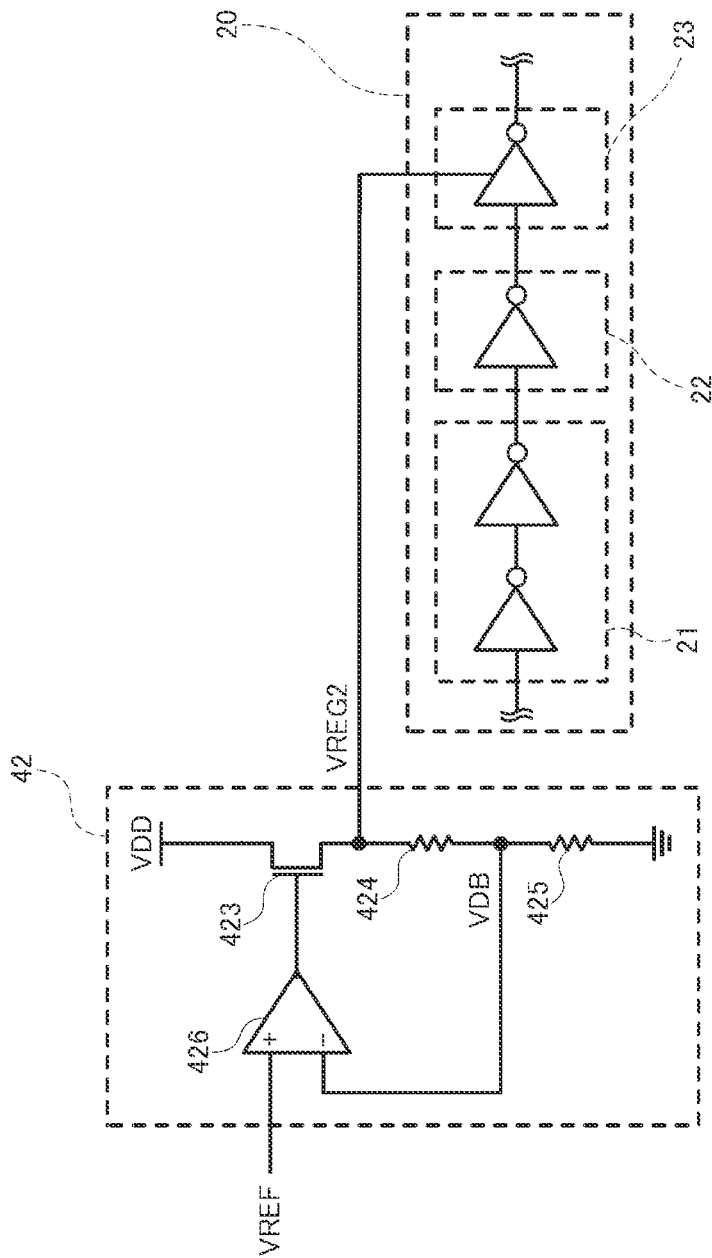
FIG. 6 is a diagram showing a schematic configuration of a second regulator.

FIG. 6 is a diagram showing a schematic configuration of a second regulator 42. The second regulator 42 is provided with a transistor 423, resistors 424, 425, and an operational amplifier 426. Further, the reference voltage VREF is input to the second regulator 42, and the second regulator 42 outputs a second regulated voltage VREG2. The second regulator 42 shown in FIG. 6 has a configuration obtained by omitting the band-limiting filter 411 and the switch circuit 412 from the configuration of the first regulator 41. It should be noted that the second regulator 42 can be provided with a configuration obtained by omitting or modifying some of these constituents, or adding other constituents.

The transistor 423 and the resistors 424, 425 are disposed in series between the power supply voltage VDD and the ground. For example, the transistor 423 is an N-type transistor, and the drain thereof is supplied with the power supply voltage VDD, and the second regulated voltage VREG2 is output from the source thereof electrically coupled to the resistors 424, 425. Further, by adjusting resistance values of the resistors 424, 425, it is possible to adjust the second regulated voltage VREG2.

The reference voltage VREF is input to a non-inverting input terminal of the operational amplifier 426, and to an inverting input terminal thereof, there is input a divisional voltage VDB obtained by dividing the second regulated voltage VREG2 with the resistors 424, 425. An output signal of the operational amplifier 426 is input to the gate of the transistor 423, and the second regulated voltage VREG2 is output from the drain of the transistor 423.

The second regulator 42 supplies the second regulated voltage VREG2 to the first output driver 23. Further, the second regulator 42 is not provided with a band-limiting filter unlike the first regulator 41, and is therefore shorter in transient response time than the first regulator 41. When the regulated voltage varies in an extremely short time, the second regulated voltage VREG2 is shorter in time necessary to stabilize from when the voltage varies compared to the first regulated voltage VREG1. In general, the transient response time of the regulator is a characteristic representing how much time it takes until the output voltage is restored to the steady state when the load rapidly increases or decreases.

1-4. Timing Chart

Figure 7:
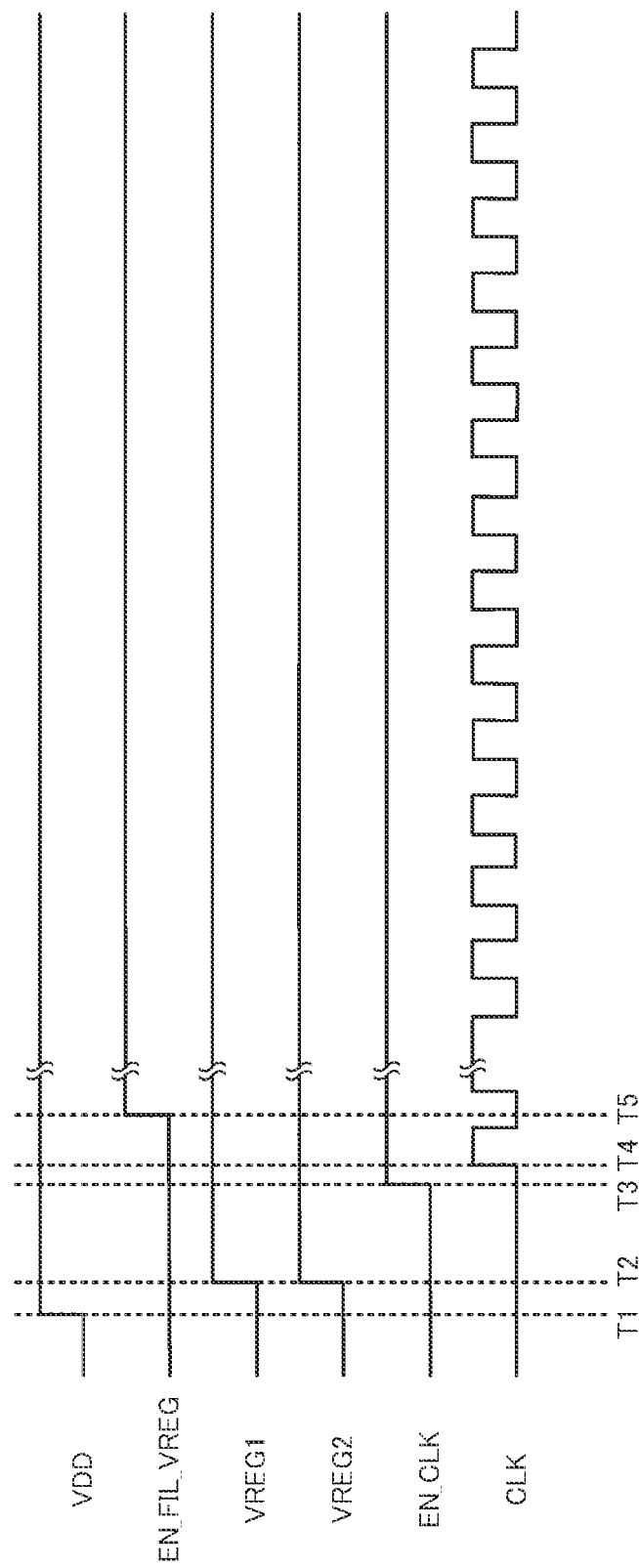
FIG. 7 is a diagram showing an example of a timing chart.

FIG. 7 is a diagram showing an example of a timing chart in the present embodiment. Specifically, FIG. 7 is a diagram showing an example of the timing chart of the power supply voltage VDD, the reference signal EN_FIL_VREG, the first regulated voltage VREG1, the second regulated voltage VREG2, the enable signal EN_CLK, and the clock signal CLK.

At a time T1, the oscillator 1 starts an operation. Supply of the power supply voltage VDD to the VDD terminal is started. The power supply voltage VDD is supplied, and the first regulator 41 and the second regulator 42 respectively generate the first regulated voltage VREG1 and the second regulated voltage VREG2.

At a time T2, the first regulator 41 starts the supply of the first regulated voltage VREG1 to the waveform shaping circuit 21 and the first pre-driver 22. Further, at the time T2, the second regulator 42 starts the supply of the second regulated voltage VREG2 to the first output driver 23.

At a time T3, the enable signal EN_CLK to be input to the first output driver 23 changes from the L level to the H level. When the enable signal EN_CLK is at the L level, the first output driver 23 does not output the clock signal CLK. When the enable signal EN_CLK is at the H level, the first output driver 23 outputs the clock signal CLK.

At a time T4, the clock signal CLK is output. At the time T3, the enable signal EN_CLK changes from the L level to the H level, and after a while, the first output driver 23 outputs the clock signal CLK. The clock signal CLK is output from the oscillator 1 via the OUT terminal and the T3 terminal.

At a time T5, the reference signal EN_FIL_VREG to be input to the first regulator 41 changes from the L level to the H level. When the reference signal EN_FIL_VREG is at the L level, the switch circuit 412 of the first regulator 41 is set to the ON state, and the band-limiting filter 411 is disabled. When the reference signal EN_FIL_VREG is at the H level, the switch circuit 412 of the first regulator 41 is set to the OFF state, and the band-limiting filter 411 is enabled.

In the period from when supply of the first regulated voltage VREG1 starts to when output of the clock signal CLK from the oscillator 1 starts, namely, a period from the time T2 to the time T4, the reference signal EN_FIL_VREG at the L level is input to the first regulator 41, and the band-limiting filter 411 is disabled. In a period from when the first regulated voltage VREG1 is supplied from the first regulator 41 to when the clock signal CLK as the output signal is output from the first output driver 23, the switch circuit 412 disables the band-limiting filter 411. Thus, the transient response time of the first regulator 41 shortens similarly to the second regulator 42, and it is possible to shorten the time from when starting the supply of the first regulated voltage VREG1 and the second regulated voltage VREG2 to when the clock signal CLK is output from the first output driver 23. The clock signal CLK output from the first output driver 23 is an example of the output signal.

At the time T5 when the output of the clock signal CLK stabilizes, the reference signal EN_FIL_VREG to be input to the first regulator 41 is changed from the L level to the H level. After the clock signal CLK as the output signal is output from the first output driver 23, the switch circuit 412 enables the band-limiting filter 411. Thus, the band-limiting filter 411 of the first regulator 41 is enabled, and it is possible to reduce the noise in the first regulated voltage VREG1.

1-5. Functions and Advantages

In the circuit device 2 according to the present embodiment, since the second regulator 42 is shorter in transient response time than the first regulator 41, there is reduced the variation in the first regulated voltage VREG1 due to an influence of the instantaneous current flowing through the first output driver 23 immediately after starting the output of the clock signal CLK from the first output driver 23.

Therefore, it is possible to improve the waveform quality immediately after starting the output of the clock signal CLK as the output signal of the first output driver 23. Further, according to this circuit device 2, since the first regulator is longer in transient response time than the second regulator 42, and thus, the high-frequency noise included in the first regulated voltage VREG1 is reduced, there is reduced the phase noise of the clock signal CLK output from the first pre-driver 22 supplied with the first regulated voltage VREG1. Therefore, it is possible to reduce the phase noise in the clock signal CLK output from the first output driver 23.

Further, in the circuit device 2 according to the present embodiment, since it is possible to reduce the noise included in the first regulated voltage VREG1 using the band-limiting filter 411, there is reduced the phase noise in the output signal of the first pre-driver 22 supplied with the first regulated voltage VREG1. Therefore, it is possible to reduce the phase noise in the clock signal CLK output from the first output driver 23.

Further, in the circuit device 2 according to the present embodiment, by disabling the band-limiting filter 411 in the period from when the first regulated voltage VREG1 and the second regulated voltage VREG2 are supplied to when the clock signal CLK is output from the first output driver 23, it is possible to shorten the transient response time of the first regulator 41. Thus, the waveform quality immediately after starting the output of the clock signal CK2 output from the first pre-driver 22 is improved, and as a result, it is possible to improve the waveform quality immediately after starting the output of the clock signal CLK output from the first output driver 23.

Further, in the circuit device 2 according to the present embodiment, by enabling the band-limiting filter 411 after the clock signal CLK is output, the phase noise in the clock signal CK2 output from the first pre-driver 22 is reduced, and it is possible to reduce the phase noise in the clock signal CLK output from the first output driver 23.

Further, in the circuit device 2 according to the present embodiment, it is possible to input the enable signal EN_CLK to output the clock signal CLK from the circuit device 2 as needed. Therefore, by stopping the output of the clock signal CLK when not needed, it is possible to suppress the power consumption of the circuit device 2.

Further, in the circuit device 2 according to the present embodiment, since the second regulator 42 is shorter in transient response time than the first regulator 41, it is possible to improve the waveform quality of the output signal immediately after the enable signal EN_CLK is activated to start the output of the clock signal CLK from the first output driver 23.

2. Second Embodiment

The output circuit 20 in a second embodiment will be described. In explaining the output circuit 20 in the second embodiment, substantially the same constituents as those of the output circuit 20 in the first embodiment will be denoted by the same reference numerals, and the description thereof will be omitted or simplified.

Figure 8:
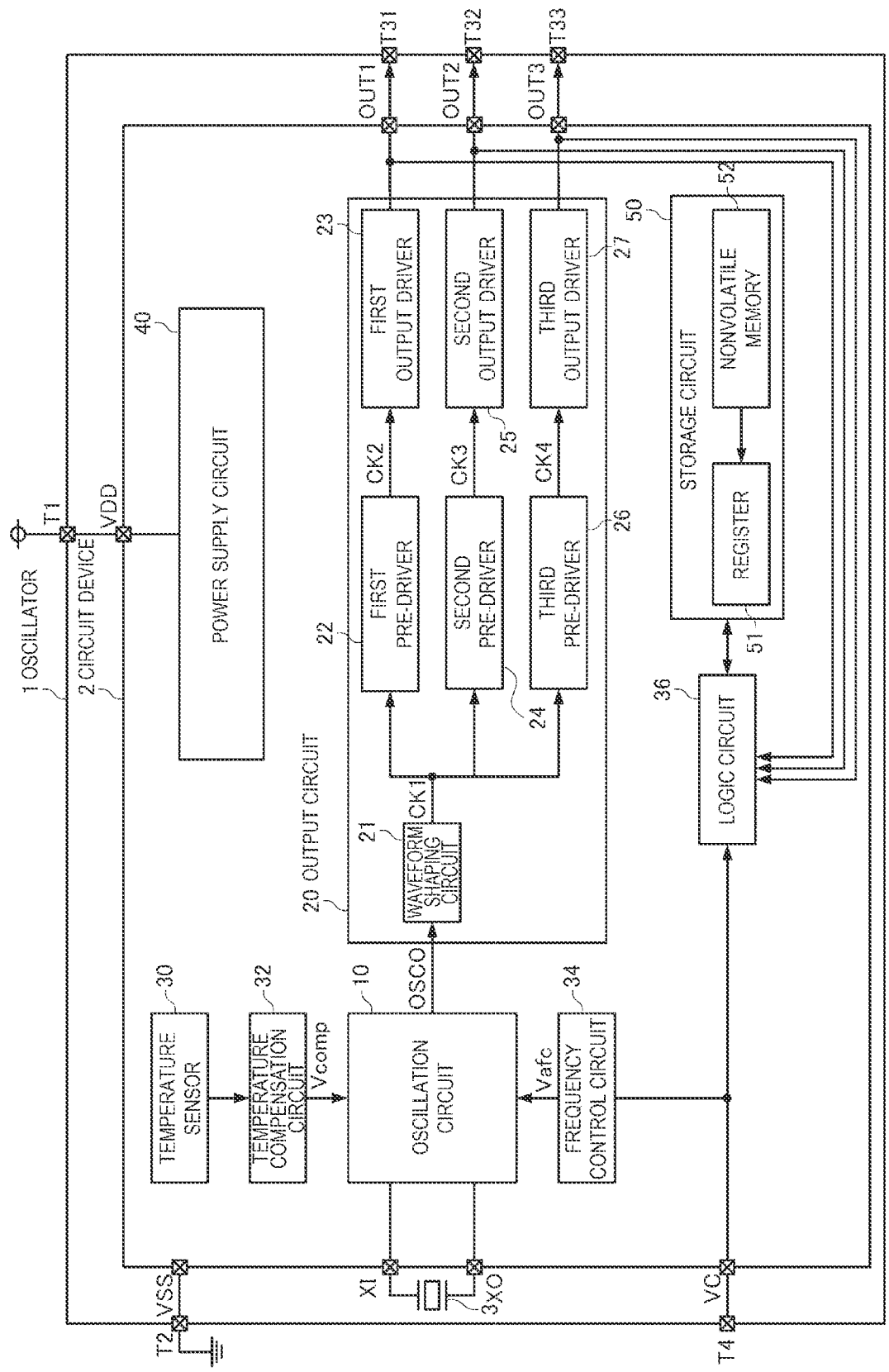
FIG. 8 is a diagram showing a configuration example of an oscillator according to a second embodiment.
Figure 9:
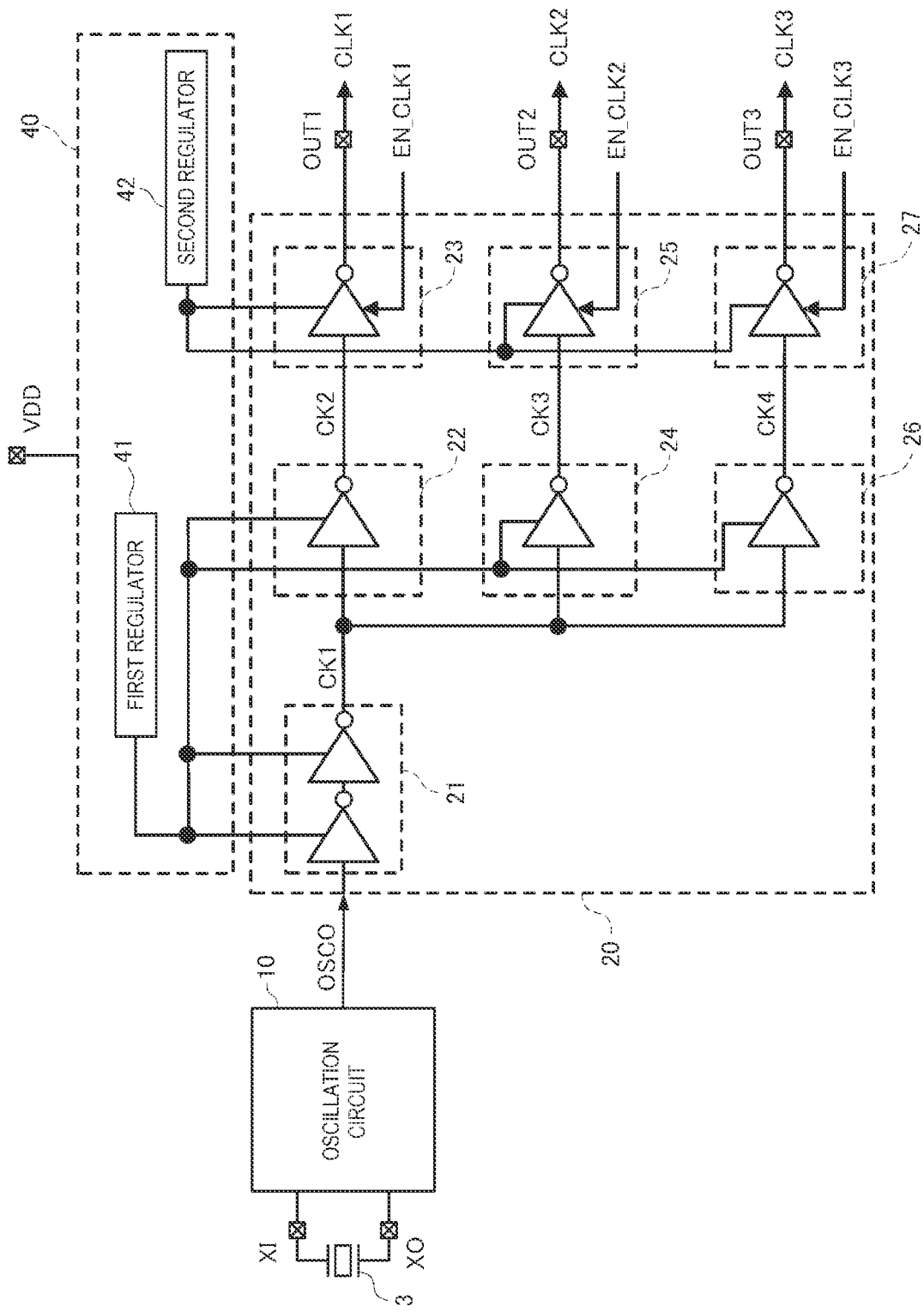
FIG. 9 is a diagram showing a schematic configuration of an output circuit in the second embodiment.

FIG. 8 is a diagram showing an example of a schematic configuration of the oscillator 1 according to the second embodiment, and FIG. 9 is a diagram showing a schematic configuration of the output circuit 20 in the second embodiment.

As shown in FIG. 8 and FIG. 9, the output circuit 20 is provided with the first pre-driver 22, a second pre-driver 24, a third pre-driver 26, the first output driver 23, a second output driver 25, and a third output driver 27. The first pre-driver 22, the second pre-driver 24, and the third pre-driver 26 are supplied with the first regulated voltage VREG1, and the first output driver 23, the second output driver 25, and the third output driver 27 are supplied with the second regulated voltage VREG2.

The waveform shaping circuit 21 performs waveform shaping on the oscillation signal OSCO to generate the clock signal CK1, and then outputs the clock signal CK1 to the first pre-driver 22, the second pre-driver 24, and the third pre-driver 26. In other words, the waveform shaping circuit 21 generates the clock signal CK1 as the first signal based on the oscillation signal OSCO, and then outputs the clock signal CK1 to the first pre-driver 22, the second pre-driver 24, and the third pre-driver 26.

The first pre-driver 22 buffers the clock signal CK1 to generate the clock signal CK2, and then outputs the clock signal CK2 to the first output driver 23.

Specifically, the first pre-driver 22 generates the clock signal CK2 as the second signal based on the clock signal CK1 as the first signal, and then outputs the clock signal CK2 to the first output driver 23.

The second pre-driver 24 buffers the clock signal CK1 to generate a clock signal CK3, and then outputs the clock signal CK3 to the second output driver 25. Specifically, the second pre-driver 24 generates the clock signal CK3 as a third signal based on the clock signal CK1 as the first signal, and then outputs the clock signal CK3 to the second output driver 25.

The third pre-driver 26 buffers the clock signal CK1 to generate a clock signal CK4, and then outputs the clock signal CK4 to the third output driver 27. Specifically, the third pre-driver 26 generates the clock signal CK4 as a fourth signal based on the clock signal CK1 as the first signal, and then outputs the clock signal CK4 to the third output driver 27.

The first output driver 23 buffers the clock signal CK2 output from the first pre-driver 22 to generate a clock signal CLK1. The clock signal CLK1 thus generated is output from the oscillator 1 via an OUT1 terminal and a T31 terminal. In other words, the first output driver 23 outputs the clock signal CLK1 as a first output signal to the OUT1 terminal based on the clock signal CK2 as the second signal. For example, the clock signal CLK1 can be a CMOS output waveform, or can also be a clipped sine wave.

The first output driver 23 is electrically coupled to the OUT1 terminal. Further, the clock signal CLK1 is output to the outside of the circuit device 2 in accordance with an enable signal EN_CLK1 supplied from the logic circuit 36. Specifically, the first output driver 23 outputs the clock signal CLK1 in accordance with the enable signal EN_CLK1.

The second output driver 25 buffers the clock signal CK3 output from the second pre-driver 24 to generate a clock signal CLK2. The clock signal CLK2 thus generated is output from the oscillator 1 via an OUT2 terminal and a T32 terminal. In other words, the second output driver 25 outputs the clock signal CLK2 as a second output signal to the OUT2 terminal based on the clock signal CK3 as the third signal. For example, the clock signal CLK2 can be a CMOS output waveform, or can also be a clipped sine wave.

The second output driver 25 is electrically coupled to the OUT2 terminal. Further, the clock signal CLK2 is output to the outside of the circuit device 2 in accordance with an enable signal EN_CLK2 supplied from the logic circuit 36.

Specifically, the second output driver 25 outputs the clock signal CLK2 in accordance with the enable signal EN_CLK2.

The third output driver 27 buffers the clock signal CK4 output from the third pre-driver 26 to generate a clock signal CLK3. The clock signal CLK3 thus generated is output from the oscillator 1 via an OUT3 terminal and a T33 terminal. In other words, the third output driver 27 outputs the clock signal CLK3 as a third output signal to the OUT3 terminal based on the clock signal CK4 as the fourth signal. For example, the clock signal CLK3 can be a CMOS output waveform, or can also be a clipped sine wave.

The third output driver 27 is electrically coupled to the OUT3 terminal. Further, the clock signal CLK3 is output to the outside of the circuit device 2 in accordance with an enable signal EN_CLK3 supplied from the logic circuit 36. Specifically, the third output driver 27 outputs the clock signal CLK3 in accordance with the enable signal EN_CLK3.

Figure 10:
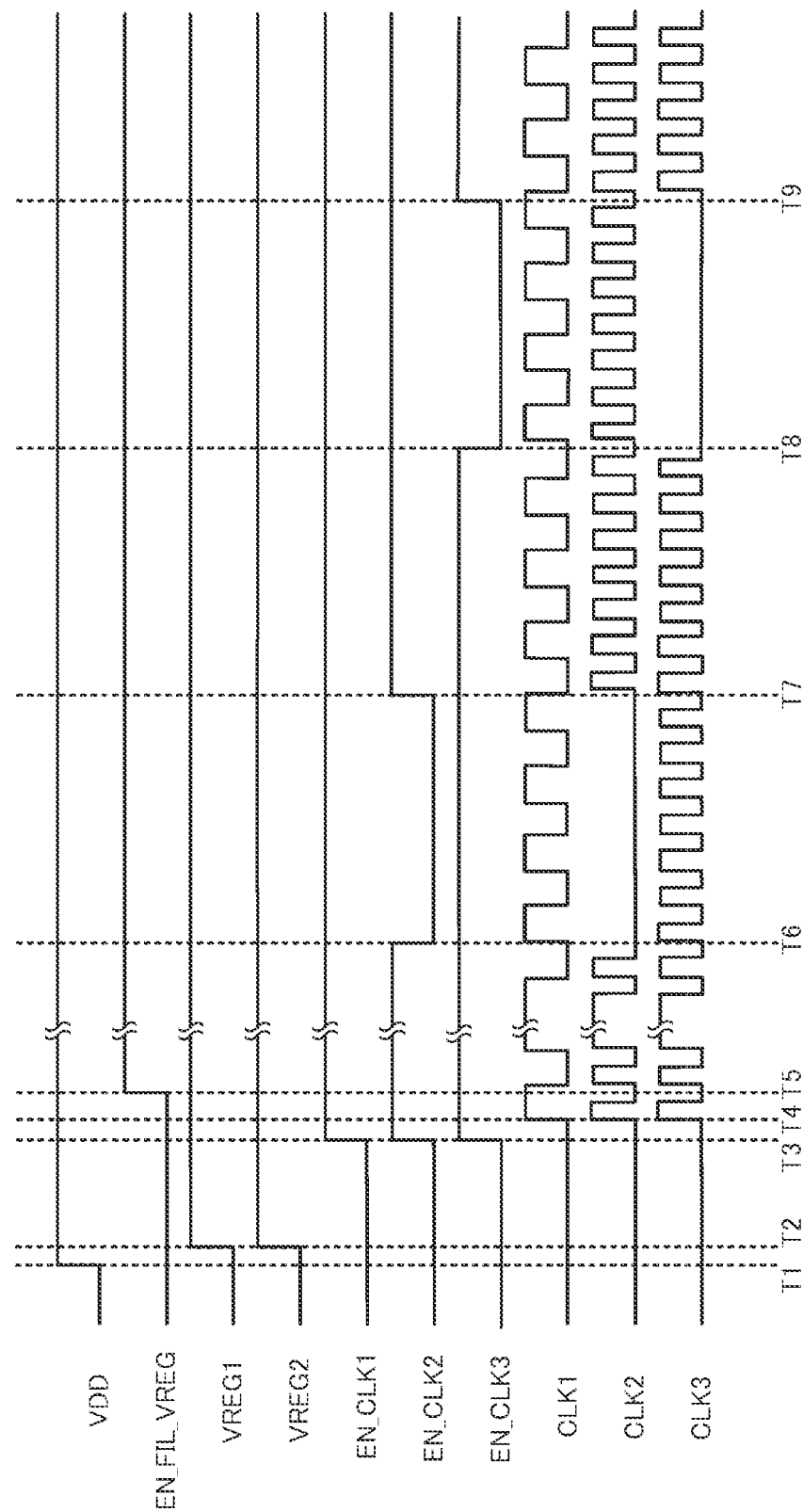
FIG. 10 is a diagram showing an example of a timing chart in the second embodiment.

FIG. 10 is a diagram showing an example of a timing chart in the present embodiment. Specifically, FIG. 10 is a diagram showing an example of the timing chart of the power supply voltage VDD, the reference signal EN_FIL_VREG, the first regulated voltage VREG1, the second regulated voltage VREG2, the enable signals EN_CLK1, EN_CLK2, and EN_CLK3, and the clock signals CLK1, CLK2, and CLK3.

At a time T1, the oscillator 1 starts an operation. Supply of the power supply voltage VDD to the VDD terminal is started. The power supply voltage VDD is supplied, and the first regulator 41 and the second regulator 42 respectively generate the first regulated voltage VREG1 and the second regulated voltage VREG2.

At a time T2, the first regulator 41 starts the supply of the first regulated voltage VREG1 to the waveform shaping circuit 21, the first pre-driver 22, the second pre-driver 24, and the third pre-driver 26. Further, at the time T2, the second regulator 42 starts the supply of the second regulated voltage VREG2 to the first output driver 23, the second output driver 25, and the third output driver 27.

At a time T3, the enable signal EN_CLK1 to be input to the first output driver 23, the enable signal EN_CLK2 to be input to the second output driver 25, and the enable signal EN_CLK3 to be input to the third output driver 27 change from the L level to the H level.

When the enable signal EN_CLK1 is at the L level, the first output driver 23 does not output the clock signal CLK1. When the enable signal EN_CLK2 is at the L level, the second output driver 25 does not output the clock signal CLK2. When the enable signal EN_CLK3 is at the L level, the third output driver 27 does not output the clock signal CLK3.

Further, when the enable signal EN_CLK1 is at the H level, the first output driver 23 outputs the clock signal CLK1. When the enable signal EN_CLK2 is at the H level, the second output driver 25 outputs the clock signal CLK2. When the enable signal EN_CLK3 is at the H level, the third output driver 27 outputs the clock signal CLK3.

At a time T4, the clock signals CLK1, CLK2, and CLK3 are output. At the time T3, the enable signals EN_CLK1, EN_CLK2, and EN_CLK3 change from the L level to the H level, and after a while, the first output driver 23 outputs the clock signal CLK1, the second output driver 25 outputs the clock signal CLK2, and the third output driver 27 outputs the clock signal CLK3. The clock signal CLK1 is output from the oscillator 1 via the OUT1 terminal and the T31 terminal, the clock signal CLK2 is output from the oscillator 1 via the OUT2 terminal and the T32 terminal, and the clock signal CLK3 is output from the oscillator 1 via the OUT3 terminal and the T33 terminal.

At a time T5, the reference signal EN_FIL_VREG to be input to the first regulator 41 changes from the L level to the H level. When the reference signal EN_FIL_VREG is at the L level, the switch circuit 412 of the first regulator 41 is set to the ON state, and the band-limiting filter 411 is disabled. When the reference signal EN_FIL_VREG is at the H level, the switch circuit 412 of the first regulator 41 is set to the OFF state, and the band-limiting filter 411 is enabled.

In the period from when supply of the first regulated voltage VREG1 and the second regulated voltage VREG2 starts to when output of the clock signals CLK1, CLK2, and CLK3 from the oscillator 1 starts, namely, a period from the time T2 to the time T4, the reference signal EN_FIL_VREG at the L level is input to the first regulator 41, and the band-limiting filter 411 is disabled. Thus, the transient response time of the first regulator 41 shortens similarly to the second regulator 42, and it is possible to shorten the period in which the first regulated voltage VREG1 is supplied to the waveform shaping circuit 21 and the first pre-driver 22. In other words, it is possible to shorten the time from when the supply of the power supply voltage VDD starts to when the clock signals CLK1, CLK2, and CLK3 are output from the oscillator 1.

At the time T5 when the output of the clock signals CLK1, CLK2, and CLK3 stabilizes, the reference signal EN_FIL_VREG to be input to the first regulator 41 is changed from the L level to the H level. Thus, the band-limiting filter 411 of the first regulator 41 is enabled, and it is possible to reduce the noise in the first regulated voltage VREG1.

At a time T6, the enable signal EN_CLK2 changes from the H level to the L level. Therefore, the second output driver 25 stops the output of the clock signal CLK2. At a time T7, the enable signal EN_CLK2 changes from the L level to the H level, and the second output driver 25 outputs the clock signal CLK2 once again.

At a time T8, the enable signal EN_CLK3 changes from the H level to the L level. Therefore, the third output driver 27 stops the output of the clock signal CLK3. At the time T8, the enable signal EN_CLK3 changes from the L level to the H level, and the third output driver 27 outputs the clock signal CLK3 once again.

In the circuit device 2 according to the second embodiment, the plurality of pre-drivers and the plurality of output drivers are provided, and thus, it is possible to realize the multi-output circuit device 2.

Further, in the circuit device 2 according to the second embodiment, since the second regulator 42 is shorter in transient response time than the first regulator 41, there is reduced the variation in the second regulated voltage VREG2 due to the influence of the instantaneous current flowing through the first output driver 23, the second output driver 25, and the third output driver 27 immediately after starting the output of the clock signals CLK1, CLK2, and CLK3 output from the first output driver 23, the second output driver 25, and the third output driver 27. Therefore, it is possible to improve the waveform quality immediately after starting the output of the clock signals CLK1, CLK2, and CLK3.

Further, in the circuit device 2 according to the second embodiment, since the first regulator 41 is longer in transient response time than the second regulator 42, there is reduced the phase noise in the clock signals CK2, CK3, and CK4 output from the first pre-driver 22, the second per-driver 24, and the third pre-driver 26 supplied with the first regulated voltage VREG1. Therefore, it is possible to reduce the phase noise in the clock signals CLK1, CLK2, and CLK3.

Further, in the circuit device 2 according to the second embodiment, for example, since there is reduced the variation in the first regulated voltage VREG1 due to the influence of the instantaneous current flowing through the first output driver 23 immediately after starting and stopping of the output of the clock signal CLK1 from the first output driver 23, it is possible to improve the quality of the clock signals CLK2 and CLK3 from the second output driver 25 and the third output driver 27. When the circuit device 2 has a plurality of output drivers, even immediately after the output of the clock signal from a certain output driver, it is possible to improve the quality of the clock signal output from another output driver.

3. Comparative Example 1

Figure 11:
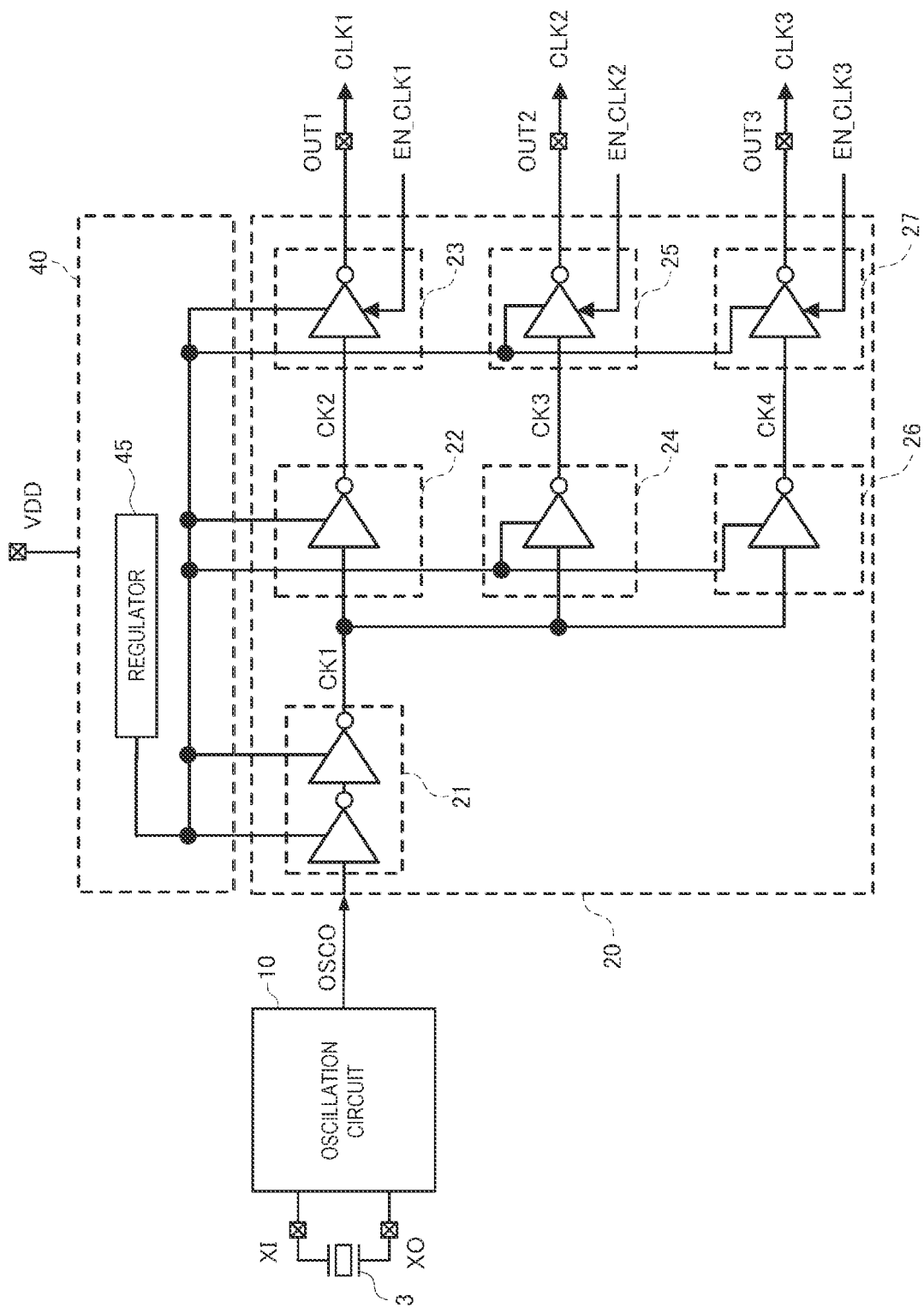
FIG. 11 is a diagram showing a schematic configuration of an output circuit in Comparative Example 1.

The output circuit 20 in Comparative Example 1 will be described. FIG. 11 is a diagram showing a schematic configuration of the output circuit 20 in Comparative Example 1. The configuration of the output circuit 20 in Comparative Example 1 is the same as in the second embodiment, but in the case of Comparative Example 1, unlike the case of the second embodiment, the pre-drivers and the output drivers are supplied with the same regulated voltage.

A regulator 45 generates a regulated voltage VREG. The regulated voltage VREG is supplied to the waveform shaping circuit 21, the first pre-driver 22, the second pre-driver 24, the third pre-driver 26, the first output driver 23, the second output driver 25, and the third output driver 27.

Further, the regulator 45 is provided with the band-limiting filter similarly to the first regulator 41 in the first embodiment and the second embodiment. For example, since the regulator 45 has a configuration which does not include a switch circuit for enabling or disabling the band-limiting filter, the band-limiting filter is enabled.

Figure 12:
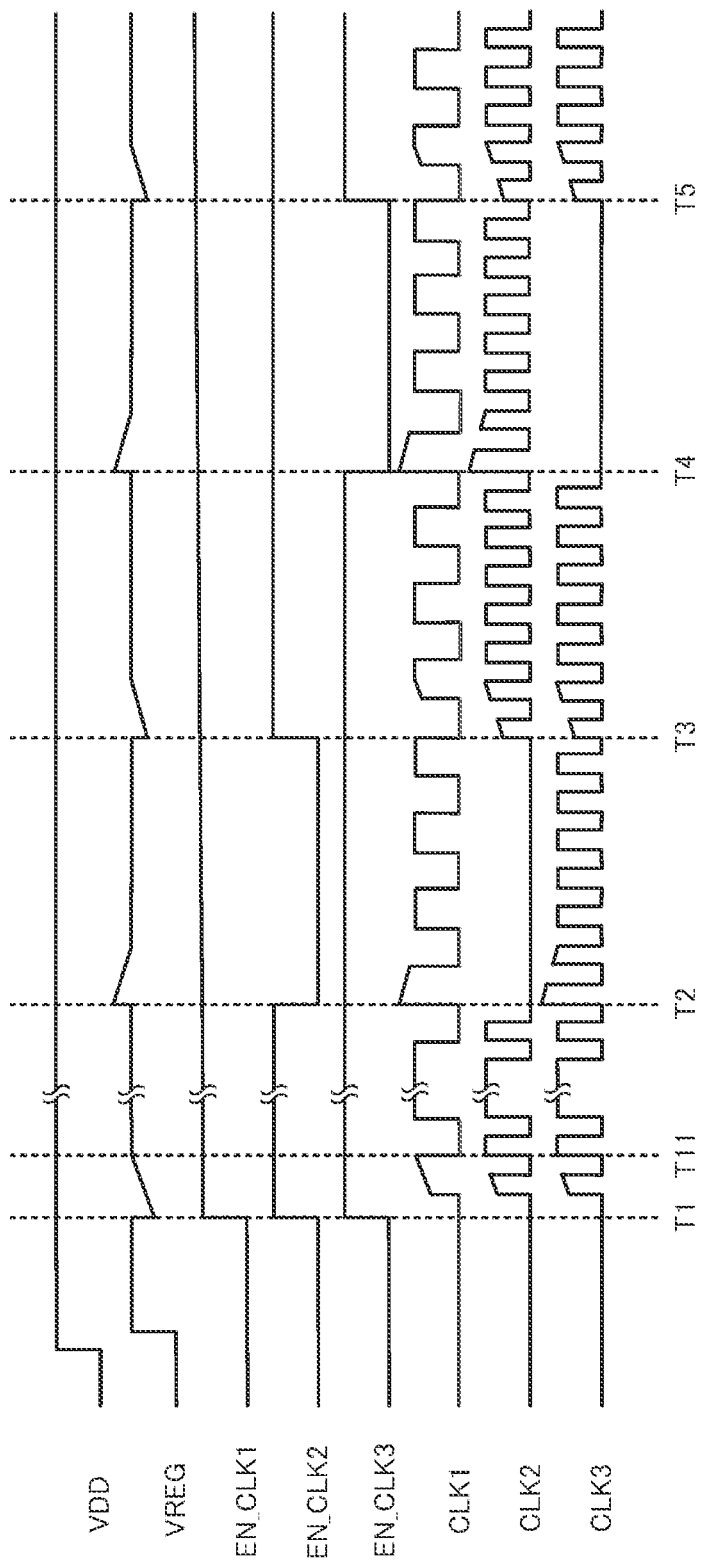
FIG. 12 is a diagram showing an example of a timing chart in Comparative Example 1.

FIG. 12 is a diagram showing an example of a timing chart in Comparative Example 1. At a time T1, the enable signals EN_CLK1, EN_CLK2, and EN_CLK3 change from the L level to the H level. In accordance with this change, the regulated voltage VREG drops, and is then restored to the original voltage at a time T11. In other words, since the band-limiting filter is enabled, the regulated voltage VREG is difficult to follow the instantaneous voltage variation, and the response time is long. In the period from the time T1 to the time T11, the amplitude of each of the clock signals CLK1, CLK2, and CLK3 is low under the influence of the variation of the regulated voltage VREG. At the time T11, the amplitude of each of the clock signals CLK1, CLK2, and CLK3 is restored.

In the period from the time T2 to the time T5, similarly to the above, the regulated voltage VREG varies at the timing at which each of the enable signals changes, and the amplitude of each of the clock signals is affected by the variation.

The waveform shaping circuit 21, the first pre-driver 22, the second pre-driver 24, the third pre-driver 26, the first output driver 23, the second output driver 25, and the third output driver 27 are supplied with the same regulated voltage VREG. When the enable signal is input to one of the output drivers, the regulated voltage VREG varies significantly to significantly affect other output drivers supplied with the same regulated voltage VREG. In other words, the significant variation in the regulated voltage VREG affects the amplitude of all of the output signals.

4. Comparative Example 2

Figure 13:
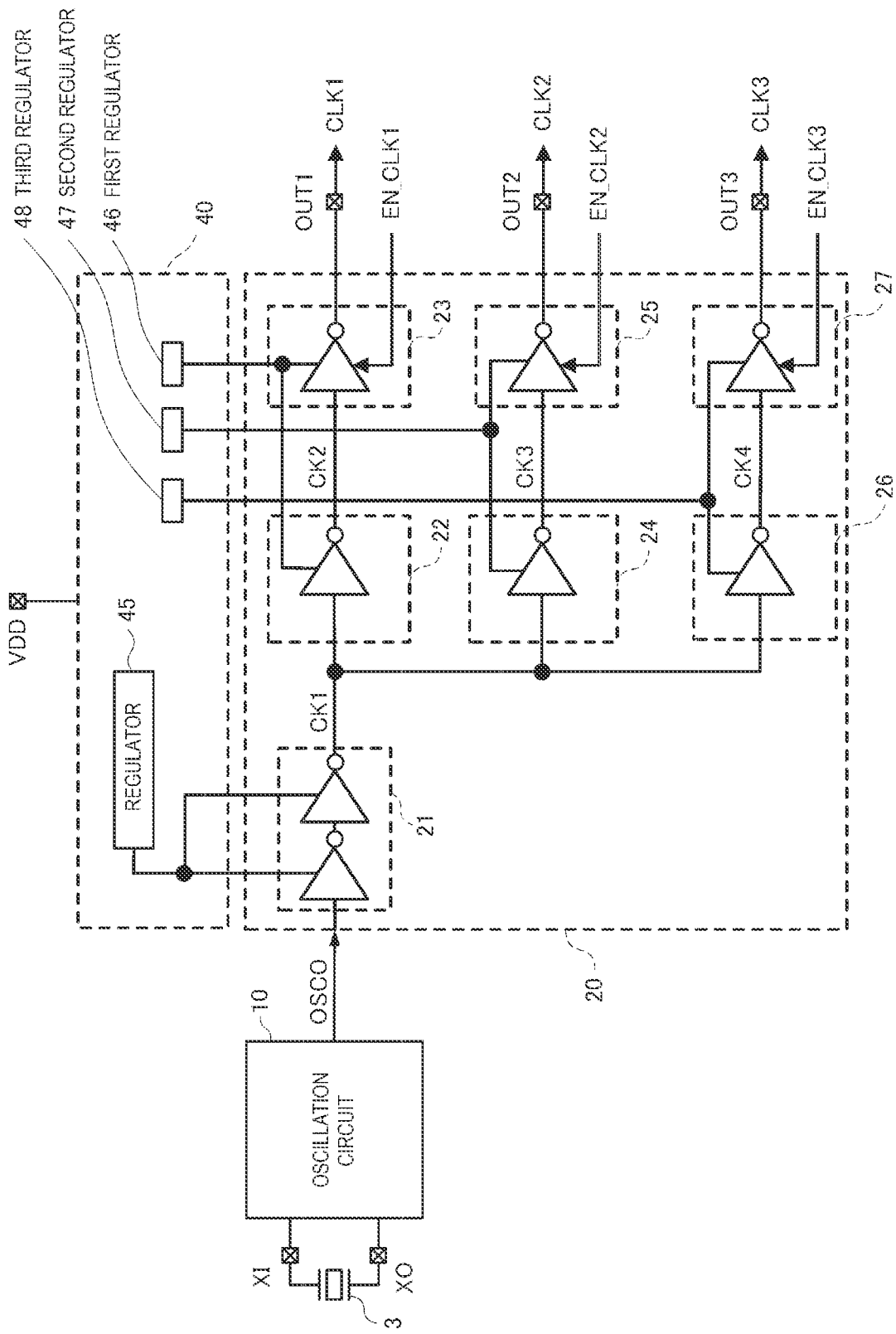
FIG. 13 is a diagram showing a schematic configuration of an output circuit in Comparative Example 2.

The output circuit 20 in Comparative Example 2 will be described. FIG. 13 is a diagram showing a schematic configuration of the output circuit 20 in Comparative Example 2. The configuration of the output circuit 20 in Comparative Example 2 is the same as in Comparative Example 1, but in the case of Comparative Example 2, unlike the case Comparative Example 1, the pre-drivers and the output drivers are supplied with respective regulated voltages different from each other.

The regulator 45 generates the regulated voltage VREG. The regulated voltage VREG is supplied to the waveform shaping circuit 21. A first regulator 46 generates a first regulated voltage VREG1. The first regulated voltage VREG1 is supplied to the first pre-driver 22 and the first output driver 23. A second regulator 47 generates a second regulated voltage VREG2. The second regulated voltage VREG2 is supplied to the second pre-driver 24 and the second output driver 25. A third regulator 48 generates a third regulated voltage VREG3. The third regulated voltage VREG3 is supplied to the third pre-driver 26 and the third output driver 27.

FIG. 14 is a diagram showing an example of a timing chart in Comparative Example 2. At a time T1, the enable signals EN_CLK1, EN_CLK2, and EN_CLK3 change from the L level to the H level. The first regulated voltage VREG1, the second regulated voltage VREG2, and the third regulated voltage VREG3 vary similarly to the case of Comparative Example 1. Therefore, the amplitudes of the clock signals CLK1, CLK2, and CLK3 are affected.

At a time T2, the enable signal EN_CLK2 changes from the H level to the L level, and thus, the second regulated voltage VREG2 varies. Since the enable signals EN_CLK1, EN_CLK3 do not change, the first regulated voltage VREG1 and the third regulated voltage VREG3 do not vary.

Since the first output driver 23 to which the enable signal EN_CLK1 is input, the second output driver 25 to which the enable signal EN_CLK2 is input, and the third output driver 27 to which the enable signal EN_CLK3 is input are supplied with the respective regulated voltages different from each other, the first regulated voltage VREG1 and the third regulated voltage VREG3 are not affected by the change in the enable signal EN_CLK2. Therefore, the amplitudes of the clock signals CLK1 and CLK3 are not affected by the variation in the second regulated voltage VREG2, and are kept constant.

At a time T3, the enable signal EN_CLK2 changes from the L level to the H level. Similarly to the case of the time T2, the amplitude of the clock signal CLK2 output from the second output driver 25 to which the enable signal EN_CLK2 is input is affected by the second regulated voltage VREG2, but the amplitudes of the clock signal CLK1 output from the first output driver 23 and the clock signal CLK3 output from the third output driver 27 are not affected by the variation in the second regulated voltage VREG2.

At a time T4, the enable signal EN_CLK3 changes from the H level to the L level, and at a time T5, the enable signal EN_CLK3 changes from the L level to the H level. In this case, the third regulated voltage VREG3 to be supplied to the third output driver 27 to which the enable signal EN_CLK3 is input varies, and thus, the amplitude of the clock signal CLK3 output from the third output driver 27 is affected. In contrast, since the first regulated voltage VREG1 and the second regulated voltage VREG2 do not vary, the amplitudes of the clock signals CLK1 and CLK2 are not affected.

In the case of Comparative Example 2, since the three regulated voltages are supplied respectively to the three pairs of the output driver and the pre-driver, it is possible to eliminate the interference between the output drivers. However, since the same regulated voltage is supplied to the pre-driver and the output driver, when the enable signal is input to the output driver, the regulated voltage varies to affect the amplitude of the output signal. Further, since the number of the regulators required increases in accordance with the number of the output drivers, there is a possibility that the configuration of the circuit device 2 becomes complicated.

5. Functions and Advantages

As described hereinabove, the circuit device 2 according to the present embodiment is capable of achieving the reduction of the noise and shortening of output response time by switching between enablement and disablement of the band-limiting filter 411. By disabling the band-limiting filter 411, it is possible to shorten the time from when the first regulated voltage VREG1 and the second regulated voltage VREG2 are supplied to when the clock signal CLK stabilizes. By enabling the band-limiting filter 411 when the clock signal CLK has stabilized, it is possible to reduce the noise in the circuit device 2.

Although the embodiments and the modified examples are hereinabove described, the present disclosure is not limited to the embodiments and the modified examples described above, but can be put into practice in a variety of aspects within the scope or the spirit of the present disclosure. For example, it is also possible to arbitrarily combine the embodiments described above.

The present disclosure includes configurations (e.g., configurations having the same function, the same way, and the same result, or configurations having the same object and the same advantages) substantially the same as the configurations described as the embodiments. Further, the present disclosure includes configurations obtained by replacing a non-essential part of the configurations described as the embodiments. Further, the present disclosure includes configurations providing the same functions and the same advantages, or configurations capable of achieving the same object as those of the configurations described as the embodiments. Further, the present disclosure includes configurations obtained by adding a known technology to the configurations described as the embodiments.

The following contents derive from the embodiments and the modified examples described above.

A circuit device according to an aspect of the present disclosure includes an oscillation circuit configured to generate an oscillation signal, a first pre-driver disposed in a posterior stage of the oscillation circuit, a first output driver disposed in a posterior stage of the first pre-driver, a first regulator configured to supply a first regulated voltage to the first pre-driver, and a second regulator configured to supply a second regulated voltage to the first output driver, wherein the second regulator is shorter in transient response time than the first regulator.

According to this circuit device, since the second regulator is shorter in transient response time than the first regulator, there is reduced the variation in the first regulated voltage due to an influence of the instantaneous current flowing through the first output driver immediately after starting the output of the output signal from the first output driver. Therefore, it is possible to improve the waveform quality immediately after starting the output of the output signal from the first output driver. Further, according to this circuit device, since the first regulator is longer in transient response time than the second regulator, and thus, the high-frequency noise included in the first regulated voltage is reduced, there is reduced the phase noise of the output signal in the first pre-driver supplied with the first regulated voltage. Therefore, it is possible to reduce the phase noise in the output signal of the first output driver.

In the circuit device according to the aspect, there may further be included a second pre-driver, and a second output driver, wherein the second pre-driver may be supplied with the first regulated voltage, and the second output driver may be supplied with the second regulated voltage.

According to this circuit device, the plurality of pre-drivers and the plurality of output drivers are provided, and it is possible to realize the multi-output circuit device. Further, since the second regulator is shorter in transient response time than the first regulator, there is reduced the variation in the second regulated voltage due to an influence of the instantaneous current flowing through the second output driver immediately after starting the output of the output signal from the second output driver. Therefore, it is possible to improve the waveform quality immediately after starting the output of the output signal from the second output driver. Further, according to this circuit device, since the first regulator is longer in transient response time than the second regulator, and thus, the phase noise in the output signal of the second pre-driver supplied with the first regulated voltage is reduced. Therefore, it is possible to reduce the phase noise in the output signal of the second output driver. Further, since the variation in the first regulated voltage due to the influence of the instantaneous current flowing through the first output driver is reduced even immediately after starting and stopping the output of the output signal from the first output driver, it is possible to improve the quality of the output signal from the second output driver. Reversely, since the variation in the second regulated voltage due to the influence of the instantaneous current flowing through the second output driver is reduced even immediately after starting and stopping the output of the output signal from the second output driver, it is possible to improve the quality of the output signal from the first output driver.

In the circuit device according to the aspect, the first regulator may be provided with a band-limiting filter.

According to this circuit device, since it is possible to reduce the noise out of the band included in the first regulated voltage using the band-limiting filter, there is reduced the phase noise in the output signal of the first pre-driver supplied with the first regulated voltage. Therefore, it is possible to reduce the phase noise in the output signal of the first output driver.

In the circuit device according to the aspect, the first regulator may be provided with a switch circuit configured to enable or disable the band-limiting filter, the switch circuit may disable the band-limiting filter in a period from when the first regulated voltage and the second regulated voltage are supplied to when the output signal is output from the first output driver, and the switch circuit may enable the band-limiting filter after the output signal is output from the first output driver.

According to this circuit device, by disabling the band-limiting filter in the period from when the first regulated voltage and the second regulated voltage are supplied to when the output signal is output from the first output driver, it is possible to shorten the transient response time of the first regulator. Thus, the waveform quality immediately after starting the output of the output signal of the first pre-driver is improved, and as a result, it is possible to improve the waveform quality immediately after starting the output of the output signal of the first output driver. Further, according to this circuit device, by enabling the band-limiting filter after the output signal is output, the phase noise in the output signal of the first pre-driver is reduced, and thus, it is possible to reduce the phase noise in the output signal of the first output driver.

In the circuit device according to the aspect, there may further be included a waveform shaping circuit disposed on a signal path between the oscillation circuit and the first pre-driver.

According to this circuit device, it is possible for the waveform shaping circuit to shape the waveform of the oscillation signal output from the oscillation circuit to thereby improve the quality of the output signal.

In the circuit device according to the aspect, the waveform shaping circuit may be supplied with the first regulated voltage.

According to this circuit device, it is possible to commonly use the first regulator as a regulator for generating the regulated voltage to be supplied to the waveform shaping circuit, and thus, it is possible to simplify the circuit device.

In the circuit device according to the aspect, the first output driver may be controlled by an enable signal.

According to this circuit device, it is possible to input the enable signal to thereby output the output signal from the circuit device as needed. Therefore, by stopping the output of the output signal when not needed, it is possible to suppress the power consumption of the circuit device. Further, according to this circuit device, since the second regulator is shorter in transient response time than the first regulator, it is possible to improve the waveform quality of the output signal immediately after the enable signal is activated to start the output of the output signal from the first output driver.

An oscillator according to an aspect of the present disclosure includes the circuit device according to the aspect, and a resonator.

According to this oscillator, since the second regulator is shorter in transient response time than the first regulator, there is reduced the variation in the first regulated voltage due to an influence of the instantaneous current flowing through the first output driver immediately after starting the output of the output signal from the first output driver. Therefore, it is possible to improve the waveform quality immediately after starting the output of the output signal from the first output driver. Further, according to this oscillator, since the first regulator is longer in transient response time than the second regulator, and thus, the high-frequency noise included in the first regulated voltage is reduced, there is reduced the phase noise of the output signal in the first pre-driver supplied with the first regulated voltage. Therefore, it is possible to reduce the phase noise in the output signal of the first output driver.

What is claimed is:

1. A circuit device comprising:
   an oscillation circuit configured to generate an oscillation signal;
   a first pre-driver disposed in a posterior stage of the oscillation circuit;
   a first output driver disposed in a posterior stage of the first pre-driver;
   a first regulator configured to supply a first regulated voltage to the first pre-driver; and
   a second regulator configured to supply a second regulated voltage to the first output driver, wherein
   the second regulator is shorter in transient response time than the first regulator.

2. The circuit device according to claim 1, further comprising:
   a second pre-driver; and
   a second output driver, wherein
   the second pre-driver is supplied with the first regulated voltage, and the second output driver is supplied with the second regulated voltage.

3. The circuit device according to claim 1, wherein the first regulator is provided with a band-limiting filter.

4. The circuit device according to claim 3, wherein
   the first regulator is provided with a switch circuit configured to enable or disable the band-limiting filter,
   the switch circuit disables the band-limiting filter in a period from when the first regulated voltage and the second regulated voltage are supplied to when the output signal is output from the first output driver, and
   the switch circuit enables the band-limiting filter after the output signal is output from the first output driver.

5. The circuit device according to claim 1, further comprising:
   a waveform shaping circuit disposed on a signal path between the oscillation circuit and the first pre-driver.

6. The circuit device according to claim 5, wherein
   the waveform shaping circuit is supplied with the first regulated voltage.

7. The circuit device according to claim 1, wherein
   the first output driver is controlled by an enable signal.

8. An oscillator comprising:
   the circuit device according to claim 1; and
   a resonator.

* * * * *